US007964970B2

(12) United States Patent
Gerhardt et al.

(10) Patent No.: US 7,964,970 B2
(45) Date of Patent: Jun. 21, 2011

(54) TECHNIQUE FOR ENHANCING TRANSISTOR PERFORMANCE BY TRANSISTOR SPECIFIC CONTACT DESIGN

(75) Inventors: Martin Gerhardt, Dresden (DE); Ralf Richter, Dresden (DE); Thomas Feudel, Radebeul (DE); Uwe Griebenow, Markkleeberg (DE)

(73) Assignee: Globalfoundries, Inc., Grand Cayman (KY)

( * ) Notice: Subject to any disclaimer, the term of this patent is extended or adjusted under 35 U.S.C. 154(b) by 245 days.

(21) Appl. No.: 11/964,494

(22) Filed: Dec. 26, 2007

(65) Prior Publication Data
US 2008/0265330 A1  Oct. 30, 2008

(30) Foreign Application Priority Data
Apr. 30, 2007  (DE) .................. 10 2007 020 258

(51) Int. Cl.
*H01L 29/40* (2006.01)
(52) U.S. Cl. .................. 257/773; 257/382; 257/E29.12; 257/E29.122; 257/E29.299; 257/E21.641
(58) Field of Classification Search .......... 257/382–385, 257/773, E29.122, E29.12, E29.299, E21.62, 257/E21.641
See application file for complete search history.

(56) References Cited

U.S. PATENT DOCUMENTS

| 5,831,316 A * | 11/1998 | Yu et al. ......................... 257/401 |
| 2002/0017689 A1 | 2/2002 | Hirano et al. .................. 257/351 |
| 2002/0153576 A1 | 10/2002 | Omi et al. ...................... 257/382 |
| 2004/0075113 A1 | 4/2004 | Nakayama .................... 257/200 |
| 2005/0285187 A1 | 12/2005 | Bryant et al. .................. 257/335 |
| 2006/0043422 A1 | 3/2006 | Chen et al. .................... 257/202 |
| 2006/0131662 A1 | 6/2006 | Yamada et al. ............... 257/374 |
| 2006/0175648 A1 | 8/2006 | Asami ........................... 257/296 |
| 2007/0132032 A1 | 6/2007 | Teo et al. ....................... 257/369 |
| 2008/0023772 A1 | 1/2008 | Kawakita ....................... 257/369 |

FOREIGN PATENT DOCUMENTS

| DE | 4037876 | 12/1998 |
| DE | 10350137 | 5/2004 |
| DE | 102004020593 | 11/2005 |
| JP | 7-131003 | 5/1995 |
| JP | 9-172169 | 6/1997 |
| JP | 11-168139 | 12/1997 |
| WO | WO 02/50914 | 6/2002 |

OTHER PUBLICATIONS

Official Communication Dated Jan. 8, 2008 for Application No. 102007020258.1-33.
PCT Search Report from PCT/US2008/004958 dated Jul. 16, 2008.

* cited by examiner

Primary Examiner — Matthew C Landau
Assistant Examiner — Jessica Hall
(74) Attorney, Agent, or Firm — Williams, Morgan & Amerson, P.C.

(57) ABSTRACT

By locally adapting the size and/or density of a contact structure, for instance, within individual transistors or in a more global manner, the overall performance of advanced semiconductor devices may be increased. Hence, the mutual interaction between the contact structure and local device characteristics may be taken into consideration. On the other hand, a high degree of compatibility with conventional process strategies may be maintained.

17 Claims, 5 Drawing Sheets

TECHNIQUE FOR ENHANCING TRANSISTOR PERFORMANCE BY TRANSISTOR SPECIFIC CONTACT DESIGN

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures, connected to a contact structure including a plurality of contact plugs.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits are, and will be, based on silicon devices, due to the high availability of silicon substrates and due to the well-established process technology that has been developed over the past decades. A key issue in developing integrated circuits of increased packing density and enhanced performance has been the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length has been considered necessary for obtaining smaller and faster transistor elements, it turns out, however, that a plurality of issues are additionally involved to maintain proper transistor performance for a reduced gate length.

For example, for a reduced gate length, typically the respective thickness of the gate insulation layer is also to be reduced in order to maintain the controllability of the conductive channel. Since the thickness of gate insulation layers comprising silicon dioxide are currently approaching the practical limits with respect to breakthrough voltage and leakage currents, while other strategies, such as dielectric materials of increased permittivity and the like, may suffer from reduced reliability, it has been proposed to enhance the drive current capability of advanced field effect transistors for a given design dimension by creating a respective strain in the channel region in order to appropriately modify the charge carrier mobility therein. For example, creating a substantially uniaxial compressive or tensile strain in the channel region may result in an increased mobility of holes and electrons, respectively. One efficient mechanism for generating a respective strain in the channel regions of field effect transistors includes the provision of a highly stressed dielectric material that covers the transistor, wherein the intrinsic stress may be transferred into the underlying semiconductor material so as to finally obtain a respective strain in the channel region. For example, well-approved materials, such as silicon dioxide, silicon nitride, carbon enriched silicon nitride and the like, may be formed by plasma enhanced chemical vapor deposition (PECVD) techniques, wherein respective process parameters may be efficiently controlled in order to obtain a desired degree and type of intrinsic stress. For instance, silicon nitride may be deposited with a high intrinsic compressive stress of up to 3 GPa or even higher, which may therefore be advantageously used in order to enhance the performance of P-type transistors. Similarly, silicon nitride may also be deposited with a moderately high tensile stress in the range of 1 GPa and higher, thereby providing the potential for increasing the drive current capability of N-channel transistors. These highly stressed materials may be incorporated into the interlayer dielectric material that covers and passivates the transistor elements, wherein respective wiring levels, so-called metallization layers, may be formed on and above the interlayer dielectric material. Consequently, in combination with reduced transistor dimensions, the respective strain-inducing mechanisms may allow the fabrication of high performance transistor elements. However, the finally obtained performance of integrated circuits and of individual transistor elements may not only depend on the specific transistor characteristics but may also be determined by the respective wiring regime that provides mutual electrical connection of individual circuit elements according to the specified circuit layout. Due to the increasing number of circuit elements per unit area, typically an even increased number of connections between these circuit elements may have to be provided, which may required sophisticated interconnect structures, wherein the continuous reduction of the cross-sectional areas demands highly conductive material and reduced parasitic capacitance between neighboring conductors. Consequently, in the respective metallization levels, highly conductive materials, such as copper in combination with low-k dielectric materials, may be used.

Of great importance for the overall performance of individual transistor elements, however, is also a respective contact structure which provides the electrical connection between the drain and source regions and the metallization level. Thus, the respective contact plugs or contact elements may have to provide a low contact resistance while at the same time not unduly affect other transistor characteristics, such as switching speed and the like. It turns out, however, that it is difficult in conventional strategies to concurrently meet these two requirements, as will be explained with reference to FIGS. 1a and 1b.

FIG. 1a schematically illustrates a cross-sectional view of a semiconductor device 100 comprising a substrate 101, for instance, a silicon-based substrate or any other appropriate carrier material having formed thereabove a silicon-based semiconductor layer 102. Furthermore, a field effect transistor 110 is formed in and above the semiconductor layer 102. The transistor 110 may comprise a gate electrode 114 formed on a gate insulation layer 115 that separates the gate electrode 114 from a channel region 116 positioned in the semiconductor layer 102. Moreover, a respective spacer structure 113 may be provided on sidewalls of the gate electrode 114. The transistor 110 further comprises highly doped semiconductor regions 111, 112 acting as a drain and a source, respectively. Hence, the region 111 may represent a source region while the region 112 may represent a drain region. It should be appreciated that the configurations of the source and drain regions 111, 112 may be substantially identical in many well-established transistor architectures, wherein the different function of the source region 111 with respect to the drain region 112 may be defined by the circuit layout, that is, the source region 111 may typically be connected to different voltage nodes compared to the drain region 112 for a specified type of transistor. For example, for an N-channel transistor, the source region 111 may actually act as a source of electrons, wherein a respective conductive channel may build up in the channel region 116 on application of an appropriate control voltage to the gate electrode 114 from the source side to the drain side, wherein the respective electrons may have a maximum kinetic energy at the drain side after acceleration by the voltage difference between the source region 111 and the drain region 112 at the beginning of a corresponding switching operation. Moreover, metal silicide regions 117 may be formed in the drain and source regions 112, 111 and on the gate electrode 114 to reduce the signal propagation delay in the gate electrode 114 and to reduce the contact resistance in the drain and source regions 112, 111.

The semiconductor device 100 further comprises an interlayer dielectric material 120, which encloses and passivates the transistor 110 and which may be comprised of two or more materials. Frequently, a silicon dioxide based material may be provided in the form of a layer 122 providing the desired passivating characteristics. Moreover, an etch stop layer 121 is typically located above the transistor 110, which exhibits a high etch selectivity with respect to the material of the layer 122 so as to allow an efficient control of a respective etch process for patterning the layer 122 in order to form respective contact plugs 131, 132 connecting to the source region 111 and the drain region 112, respectively. For instance, the etch stop layer 121 may be comprised of silicon nitride which may have a high etch resistivity with respect to a plurality of anisotropic etch recipes for etching silicon dioxide based materials. The contacts or contact plugs 131, 132 may be formed on the basis of any appropriate conductive material wherein, as previously explained, metals may typically be used to provide low contact resistance so as to not unduly negatively affect the overall performance of the transistor 110. For example, tungsten, copper, aluminum, or any other metals may typically be used wherein appropriate conductive barrier layers (not shown) may be provided in combination with the respective conductive material.

The semiconductor device 100 as shown in FIG. 1a may be formed on the basis of the following processes. The semiconductor layer 102 may be patterned on the basis of well-established process techniques in order to define appropriate active areas for forming therein one or more transistor elements, such as the transistor 110, or other circuit elements. For this purpose, shallow trench isolation structures may be formed by lithography, etch, deposition and planarization techniques. Thereafter, a basic doping concentration may be created within the respective active regions in accordance with the respective transistor characteristics. Thereafter, the gate electrode 114 and the gate insulation layer 115 may be formed on the basis of well-established strategies including the deposition and/or oxidation or other modification of a base material to obtain the gate insulation layer 115 with a desired thickness, which may be approximately 1-2 nm for silicon dioxide based layers of highly advanced field effect transistors. The gate electrodes 114 may be formed by deposition and subsequent sophisticated patterning techniques. Thereafter, the drain and source regions 112, 111 may be formed on the basis of appropriately designed implantation cycles using the spacer structure 113, which may have different lateral dimensions during the respective implantation processes. Intermittently, and after the implantation processes, appropriate anneal processes may be performed to activate the dopants and re-crystallize the drain and source regions 112, 111. If required, the metal silicide regions 117 may then be formed in the gate electrode 114 and the drain and source regions 112, 111. Next, the etch stop layer 121 may be formed, wherein typically, in advanced applications, a high internal stress may be generated in the layer 121 in order to provide the required type and amount of strain in the channel region 116, thereby enhancing the charge carrier mobility therein and thus the drive current capability. As previously explained, silicon nitride and other materials may be advantageously deposited so as to exhibit a high intrinsic stress. Thereafter, the dielectric layer 122 may be formed by any appropriate deposition technique, possibly followed by a planarization step in order to provide superior surface characteristics for a subsequent lithography and patterning sequence in order to form respective openings in the interlayer dielectric material 120. Thereafter, the respective openings may be filled with an appropriate material, such as tungsten, wherein an appropriate barrier material may be provided, as previously explained.

During the operation of the transistor 110, the performance thereof is determined by the characteristics of the conductive path defined by the contact 131 through the silicide region 117 into the source region 111, the channel region 116 into the drain region 112 and via the metal silicide region 117 and the contact element 132 back into a corresponding metal line in a metallization layer formed above the interlayer dielectric material 120. For instance, by creating a respective strain in the channel region 116 and enhancing the dopant profiles in the drain and source regions 112, 111, superior switching characteristics and current drive capability may be achieved. To maintain a desired low contact resistance, typically a plurality of respective contact elements 131 connecting to the source region 111 and a plurality of contact elements 132 connecting to the drain region 112 are provided. On the other hand, the contact elements 131, 132 may have a significant influence on the overall stress transfer into the channel region 116, since the highly stressed material of the etch stop layer 121 may be removed in these areas, which therefore may not contribute to the desired enhancement of the drive current capability. Furthermore, the fringing capacitance with respect to the gate electrode 114, caused by the contacts 131 and 132, may also have an adverse affect on the overall transistor performance. Thus, from the point of view of a reduced contact resistance, a large number of respective contact elements 131, 132 with moderately large lateral target dimensions may be desirable, while in view of strain characteristics and in view of the fringing capacitance with respect to the gate electrode 114, a reduced number and/or size of the contact elements 131, 132 is desirable. Consequently, the design of the contact elements 131, 132 is a compromise between these requirements.

FIG. 1b schematically illustrates a top view of the semiconductor device 100, wherein the respective contact elements 131 at the source side and the respective contact elements 132 at the drain side are provided with a specific layout defined by the lateral dimension, indicated as L, of the contact elements and also by a respective distance, indicated as D, wherein these dimensions L, D are to be understood as design dimensions, i.e., as target values, which may slightly vary according to process fluctuations in actual devices. The respective lateral dimension L and the lateral distance D are typically the same for all of the circuit elements in the semiconductor device 100. Consequently, a respective gain in transistor performance obtained by device scaling and advanced strain-inducing mechanisms may significantly depend on the contact structure and may result in a performance gain less than expected due to the above-explained adverse influence on specific transistor characteristics.

The present disclosure is directed to various techniques and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to semiconductor devices and techniques for forming the same, in which the layout of contact structures in semiconductor devices may be locally varied in order to locally obtain specifically designed device characteristics. In this way, the mutual interaction between the contact structure and the respective circuit element may be adapted in a highly local manner, for instance, even within a single transistor element, in order to appropriately balance the advantage of a low ohmic contact with respect to negatively influencing other transistor characteristics, such as the strain-inducing mechanism, the generation of a high fringing capacitance and the like. For instance, in some cases, the stress relaxation caused by the contact elements with respect to a stressed dielectric material in the interlayer dielectric material may be more severe for P-channel transistors, since typically the compressive stress values obtained by presently available deposition techniques may be significantly higher compared to corresponding tensile stress values. On the other hand, the overall contact resistance is less critical for the P-channel transistor, since its intrinsic resistance, i.e., defined by the charge carrier mobility, is higher compared to the N-channel transistor. Consequently, an increase of the contact resistance may not necessarily negatively influence the overall series resistance, as the dominant factor may be the resistance of the highly doped semiconductor regions of the P-channel transistor, while at the same time an increased amount of strain may be induced in the respective channel regions. In other cases, it has been found that a voltage drop due to increased contact resistance may impact the overall transistor performance more intensively at the source side compared to the drain side. On the other hand, a capacitive coupling, and thus the fringing capacitance, between the drain contacts and the gate electrode may have a higher influence on the overall switching performance, since the drain side is typically the switching node of the transistor. Consequently, providing a reduced contact resistance at the drain side so as to reduce the fringing capacitance may be compensated for, or even overcompensated for, by a gain of switching performance, while reduced contact resistance at the source side results in enhanced transistor performance while not unduly affecting the switching behavior. Consequently, for otherwise identical design rules and process techniques, enhanced transistor performance may be obtained by locally varying the characteristics of the respective contact structures when taking into consideration locally varying influences on the operating behavior of the transistor when designing the contact structure.

One illustrative semiconductor device disclosed herein comprises a first transistor having a drain region and a source region and a plurality of drain contacts connecting to the drain region, wherein each of the plurality of drain contacts has a first lateral target dimension. Furthermore, the semiconductor device comprises a plurality of source contacts connecting to the source region, wherein each of the plurality of the source contacts has a second lateral target dimension that differs from the first lateral target dimension.

A further illustrative semiconductor device disclosed herein comprises a first transistor having a drain region and a source region and a first plurality of drain contacts connecting to the drain region. Moreover, the semiconductor device comprises a second plurality of source contacts connecting to the source region, wherein the number of contacts of the first plurality differs from the number of contacts of the second plurality.

Yet another illustrative semiconductor device disclosed herein comprises a first transistor having a drain region and a source region and a second transistor having a drain region and a source region. The semiconductor device further comprises an interlayer dielectric material covering the first and second transistors. Furthermore, a first contact structure is provided that connects to the drain region and the source region of the first transistor and comprises contact elements extending through the interlayer dielectric material, wherein the first contact structure is designed according to a first layout defined by lateral target dimensions of the contact elements and target distances between the contact elements. The semiconductor device further comprises a second contact structure connecting to the drain region and source region of the second transistor and comprising contact elements extending through the interlayer dielectric material, wherein the second contact structure is designed according to a second layout defined by a lateral target dimension of the contact elements and target distances between the contact elements, and wherein the second layout differs from the first layout.

BRIEF DESCRIPTION OF THE DRAWINGS

The disclosure may be understood by reference to the following description taken in conjunction with the accompanying drawings, in which like reference numerals identify like elements, and in which:

FIG. 1b schematically illustrates a top view of the conventional semiconductor device shown in FIG. 1a;

FIG. 2b schematically illustrates a cross-sectional view of the device of FIG. 2a;

Figure 1A:
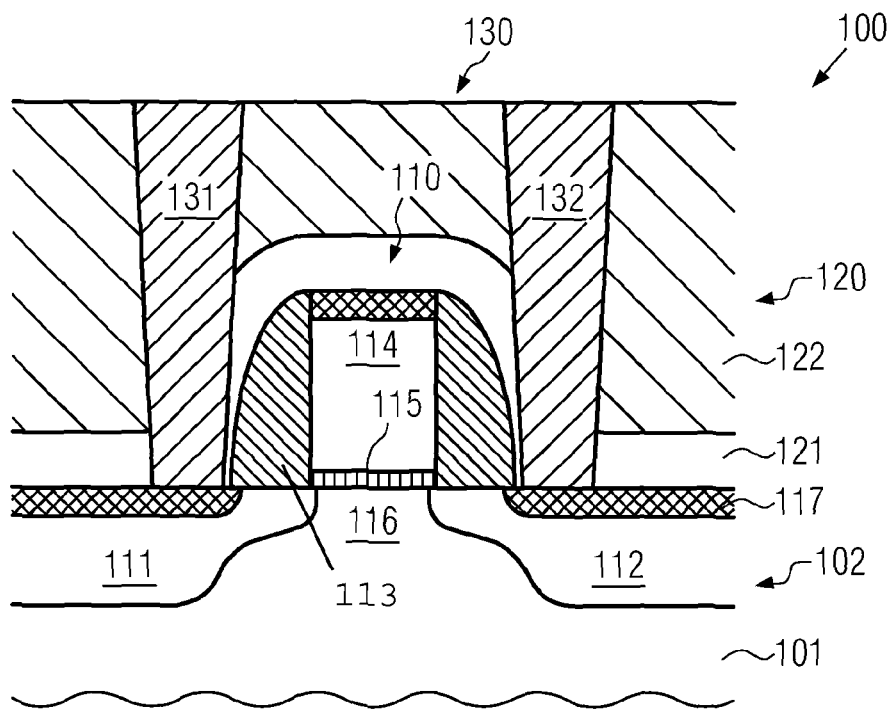
FIG. 1a schematically illustrates a cross-sectional view of a semiconductor device including a transistor and a contact structure formed according to conventional techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to devices and techniques for enhancing the transistor performance of advanced semiconductor devices by locally varying the characteristics of a contact structure so as to take into consideration local and device specific interactions between the contact structure and the transistor device. It has been recognized that the interaction of respective contacts with transistor characteristics may be different for different types of transistors and may even be different within individual transistors, thereby providing the potential for locally adapting the characteristics of the respective contact structure, i.e., the lateral size and the distance between the contacts, in an appropriate manner so as to reduce a negative impact of the contact structure. A respective local adaptation of the characteristics of the contact structure may be accomplished on the basis of locally different process conditions, for instance caused by the respective manipulation of lithography masks, etch processes and the like. In other cases, the design of the respective contact structure may be locally varied, for instance, by appropriately adapting the "contact density," that is, to reduce the number of contact elements along the transistor width direction, thereby reducing the effective amount of contact material that is present in the respective transistor side.

It should be appreciated that the principles disclosed herein are highly advantageous in the context of sophisticated semiconductor devices including highly scaled transistor elements, since here further performance gain obtained by other highly complex mechanisms, such as stress transfer mechanisms, may be less than expected when combined with conventional contact regimes. Moreover, respective asymmetric behavior of the transistor characteristics may be more pronounced for highly scaled devices so that a corresponding adaptation may have a significantly enhanced effect compared to less critical semiconductor devices. However, since respective modifications of the contact regime may be readily implemented in many conventional process strategies without significant adaptations, a respective gain in performance may also be obtained for semiconductor devices and transistors with less critical dimensions of approximately 100 nm and more. Consequently, unless specifically set forth in the appended claims or the specification, the subject matter disclosed herein should not be considered as being restricted to specific device dimensions and a respective technology node.

Figure 1B:
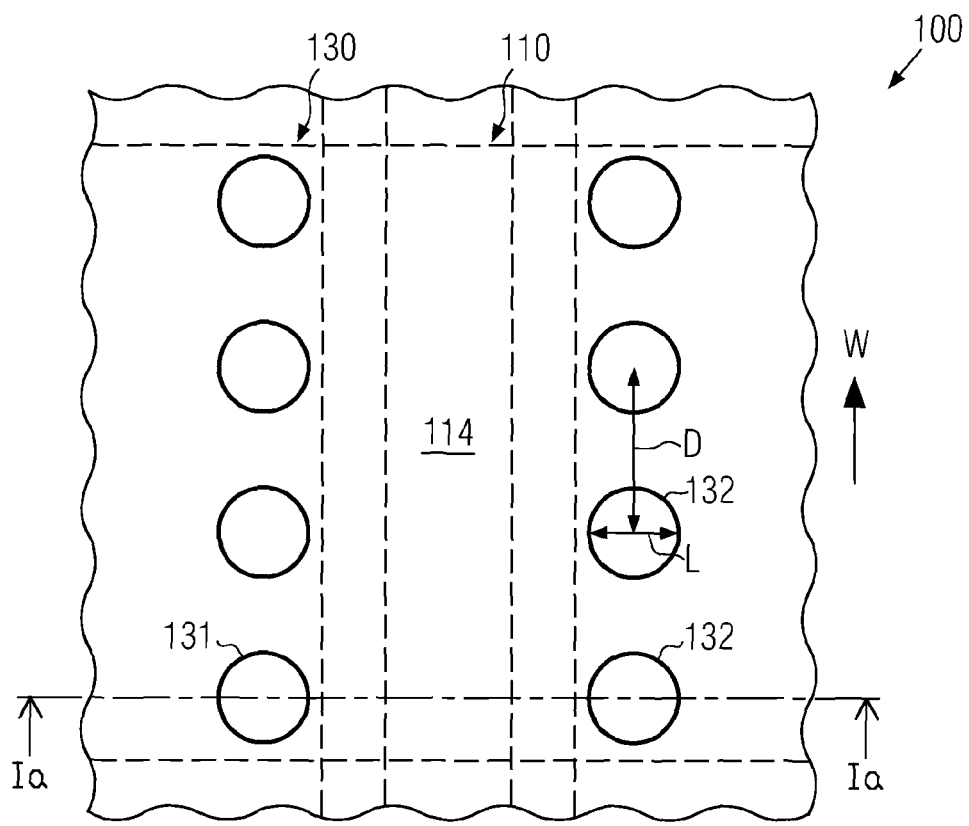
Figure 2A:
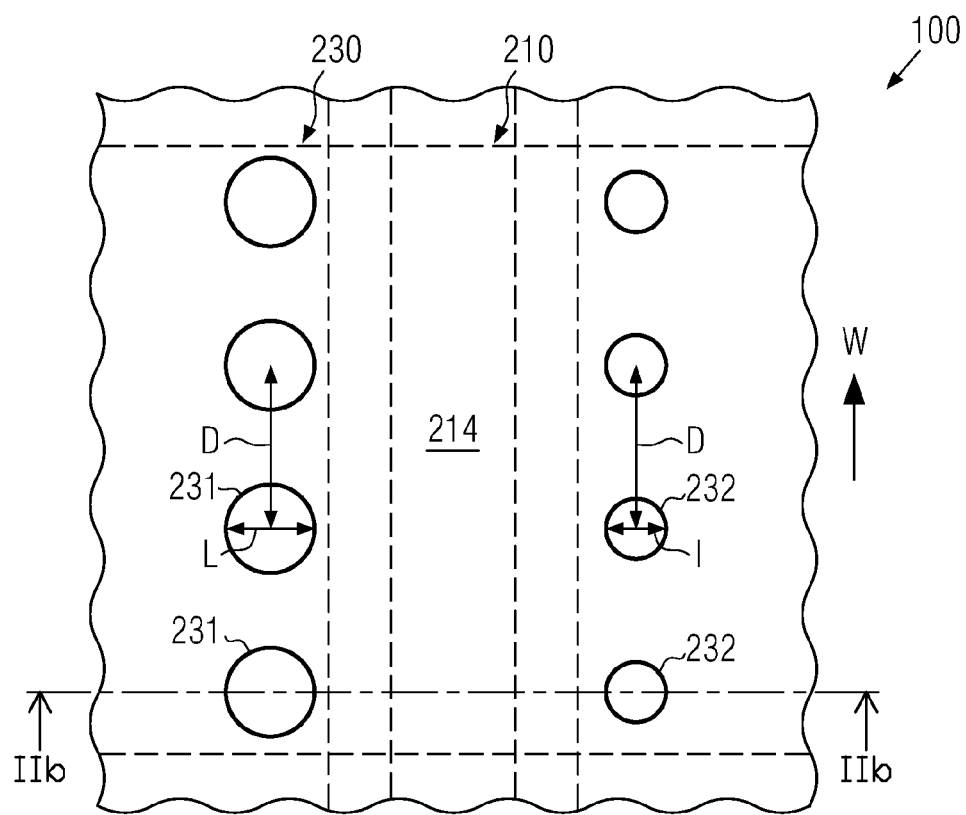
FIG. 2a schematically illustrates the top view of a transistor having differently sized contact elements at the drain side and the source side according to illustrative embodiments disclosed herein.

FIG. 2a schematically illustrates a top view of a semiconductor device 200 comprising a transistor 210 having a contact structure 230 including a plurality of source contact elements 231 and a plurality of drain contact elements 232. The respective contact elements 231, 232 may be arranged in a substantially straight line along the transistor width direction, indicated as W, wherein the respective contacts 231 and 232 may be separated by a gate electrode 214 of the transistor 210. It should be appreciated that the gate electrode 214, as well as the entire transistor 210, may be enclosed by a respective interlayer dielectric material which will be described when referring to the cross-sectional view shown in FIG. 2b. In the embodiment shown, the contact structure 230 may be asymmetric in its design in order to enhance the performance of the transistor 210. As previously explained, a voltage drop outside of the actual transistor 210 at the source side of the transistor 210 may result in a reduction of the current drive capability of the device 210 to a higher degree compared to a similar voltage drop at the drain side so that the amount of conductive material of the contacts 231 may be selected moderately high as is compatible with the respective design rules and process requirements. That is, a representative lateral dimension, for instance the diameter of the respective contact openings 231 at a specified height position, when substantially annular contacts are considered, may be selected such that a desired low contact resistance may be obtained. In other cases, any other representative lateral dimension may be used, depending on the actual cross-sectional shape of the contact elements 231, 232. Additionally, the lateral distance between two neighboring contacts of the structure 230 may also be selected so as to obtain the desired overall resistance characteristics. That is, the lateral distance D may substantially represent the number of contact elements per unit length in the transistor width direction. In the embodiment shown, the corresponding lateral distance D and thus the respective number of contacts per unit length or "contact density" may be identical at the drain side and the source side, i.e., the number of source contacts 231 may be equal to the number of drain contacts 232, whereas the lateral dimension may be reduced, as indicated as l, in order to reduce the fringing capacitance with respect to the gate electrode 214 at the drain side, which may have an influence on the resulting switching behavior, as previously explained. Consequently, for otherwise identical transistor characteristics of the transistor 210 compared to a conventional transistor having the same contact layout at the drain side and the source side, as shown in FIGS. 1a and 1b, an enhanced transistor performance may be obtained. For instance, the lateral dimension L of the contact elements 231 may be increased compared to a conventional design for the same technology node, if compatible with the technology standards used, while the lateral size l of the contacts 232 may be reduced within the limits set by process techniques involved in forming the contact structure 230.

Figure 2B:
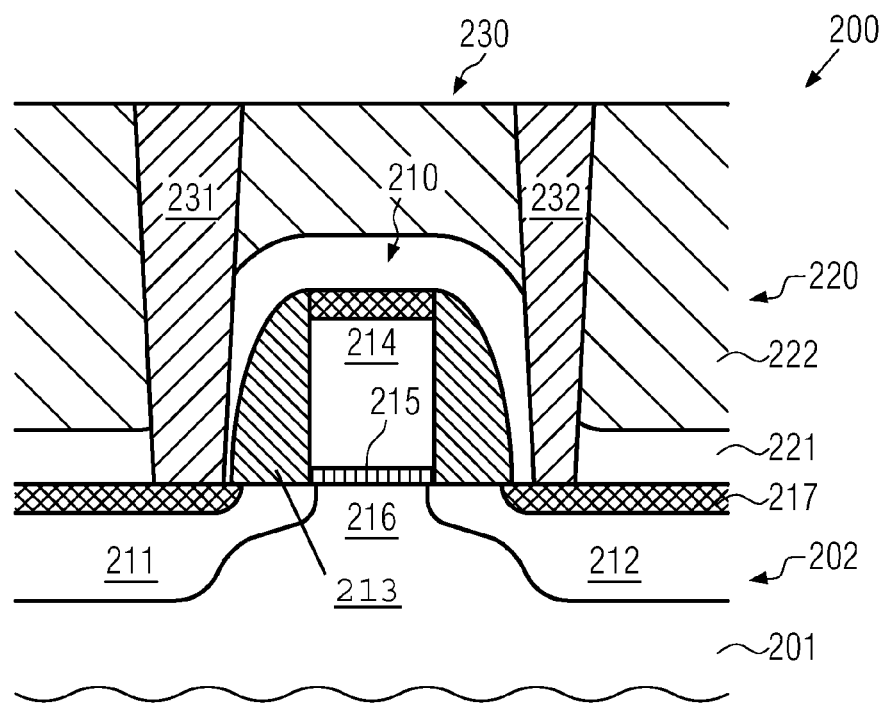

FIG. 2b schematically illustrates a cross-sectional view of the device 200 along the line IIb-IIb of FIG. 2a. As shown, the device 200 may comprise a substrate 201 having formed thereabove a semiconductor layer 202. The substrate 201 may represent any appropriate carrier material for forming thereabove the semiconductor layer 202, which may be a silicon-based semiconductor layer or any other semiconductor material suitable for forming therein and thereon the transistor 210. In some illustrative embodiments, the substrate 201, in combination with the semiconductor layer 202, may form a silicon-on-insulator (SOI) configuration wherein the semiconductor layer 202 may be formed on a corresponding buried dielectric material (not shown), such as a silicon dioxide layer and the like. Furthermore, the transistor 210 may comprise a gate electrode 214 that is formed on a gate insulation layer 215, which separates the gate electrode 214 from a channel region 216. Furthermore, a source region 211 and a drain region 212 are provided and are in contact with the respective contact elements 231, 232, respectively, by respective metal silicide regions 217. Furthermore, a respective spacer structure 213 may be provided. An interlayer dielectric material 220, which may comprise two or more different materials or sub-layers, such as an etch stop layer 221 and a dielectric layer 222, may be formed so as to enclose and passivate the transistor 210. With respect to the components described so far, the same criteria apply as previously explained with reference to the device 100, except for the asymmetry with respect to the contacts 231, 232 compared to a conventional device which has substantially identically sized and spaced contact elements.

Furthermore, the device 200 may be formed on the basis of substantially the same process techniques wherein, contrary to the conventional process strategy, after forming the interlayer dielectric material 220, the subsequent patterning sequence may be modified in order to obtain the desired asymmetric configuration of the contact structure 230. For instance, a respective lithography mask may be provided to define different target values for the lateral dimension and/or the distance between the contacts 231 and 232. It should be appreciated that a respective lateral target dimension for the contacts 231, 232 may be understood as at least one representative lateral dimension at a specified location, for instance, at the bottom of the contacts 231, 232 or at the top thereof, wherein a certain amount of deviation may unintentionally occur due to respective process fluctuations and the like. It should be appreciated that, during the patterning of respective openings for the contacts 231, 232, the etch stop layer 221 may provide a sufficient process margin in order to provide reliable control of the corresponding patterning sequence. For instance, due to the different aspect ratio of the corresponding openings for the elements 231, 232, a different etch rate may locally occur, which, however, may be accommodated by the etch stop layer 221. Hence, a high degree of process compatibility may be achieved with respect to the conventional strategy, as previously described with reference to the device 100, while nevertheless obtaining enhanced performance by reducing the fringing capacitance at the drain side and also reducing the contact resistance at the source side. It should be appreciated that the asymmetry of the contact structure with respect to the contacts 231 and 232 may also be achieved by modifying only one of the lateral target dimensions with respect to a conventional design of a transistor of the same technology node. For example, if a further reduction of the lateral dimensions L may not be compatible with the overall process strategy, the dimension at the source side may be increased, since, in this case, an increase of this dimension may then be less critical.

Figure 2C:
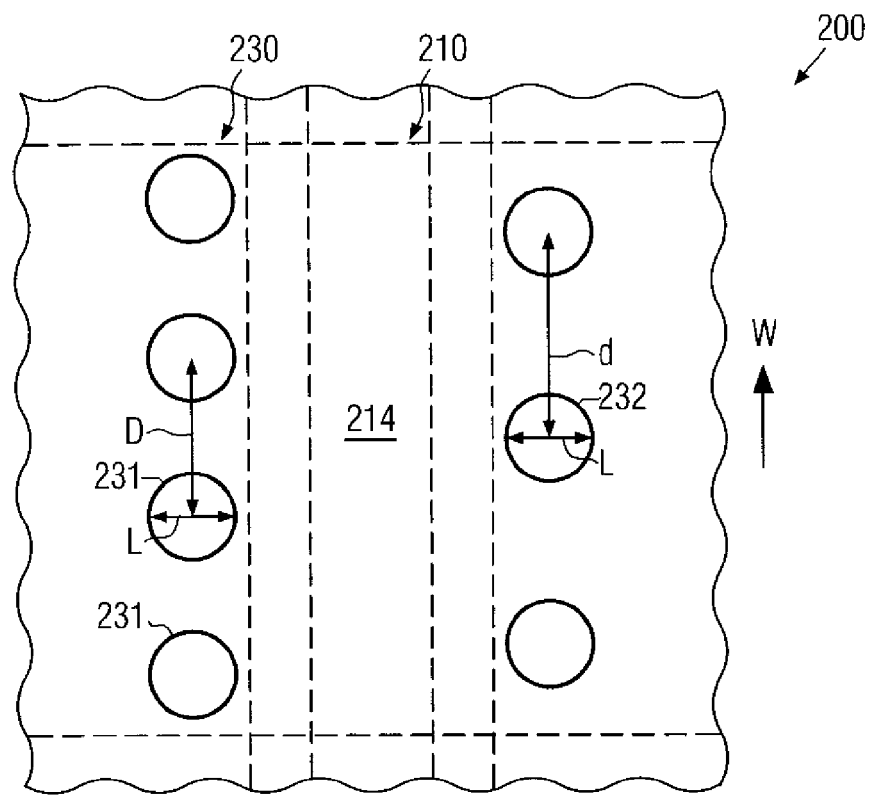
FIGS. 2c-2d schematically illustrate top views of further transistor elements having an asymmetric configuration with respect to the contact structure at the drain side and the source side by varying the number and the lateral size of the contact elements, respectively, according to still further illustrative embodiments.

FIG. 2c schematically illustrates the semiconductor device 200 according to a further illustrative embodiment. In this case, the respective amount of contact material at the drain side may be reduced so as to reduce the fringing capacitance by modifying the corresponding contact density for a given lateral target dimension of the contacts 231, 232. That is, the lateral dimension L may be substantially identical for each of the contacts 231, 232, whereas the distance between neighboring contacts 232 may be increased, thereby reducing the number of contact elements that may be positioned at the drain side of the transistor 210. In this case, the respective process conditions during the patterning of the contact structure 230 may be substantially identical for the contacts 231 and 232, thereby providing a high degree of process uniformity, while nevertheless significantly reducing the fringing capacitance while maintaining a desired low resistance at the source side, as previously explained. It should be appreciated that the lateral target dimension L may be selected in conformity with the respective technology involved so as to provide, in some illustrative embodiments, the maximum conductivity at the source side that is compatible with the device requirements and the technological capabilities.

Figure 2D:
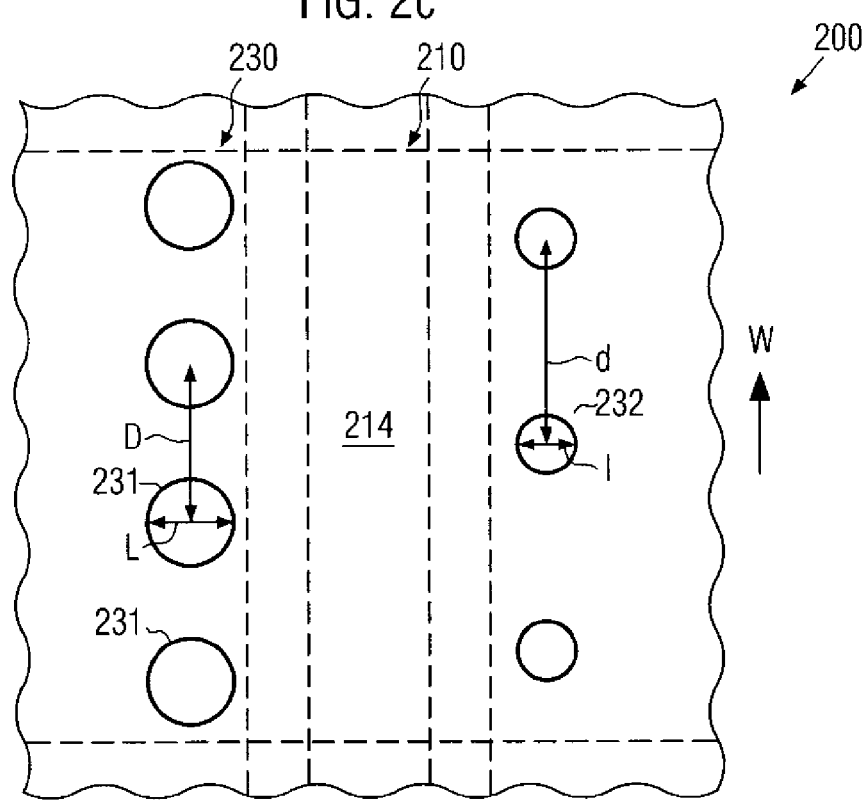

FIG. 2d schematically illustrates the device 200 according to a further illustrative embodiment. As shown, the contact structure 230 may now comprise the contact elements 231 at the source side with an appropriate lateral target dimension L and a respective lateral target distance D in order to obtain a desired low contact resistance in combination with appropriate patterning conditions. The contact elements 232 in this case may differ in their lateral target dimension l and in their lateral target distance d. For instance, if a significant reduction of the lateral dimension L at the source side may not be compatible with respective design and process techniques so as to obtain the respective modified lateral dimension l of the contacts 232 at the drain side, a respective moderate reduction may be performed and additionally the corresponding lateral distance may be increased with respect to the distance D in the respective layout of the contact structure 230 so as to obtain the desired increased distance d. Hence, respective "mild" adaptations may be performed with respect to the lateral distance and the lateral dimension, while nevertheless providing a desired significant reduction of the respective fringing capacitance and/or of the voltage drop at the source side.

Figure 2E:
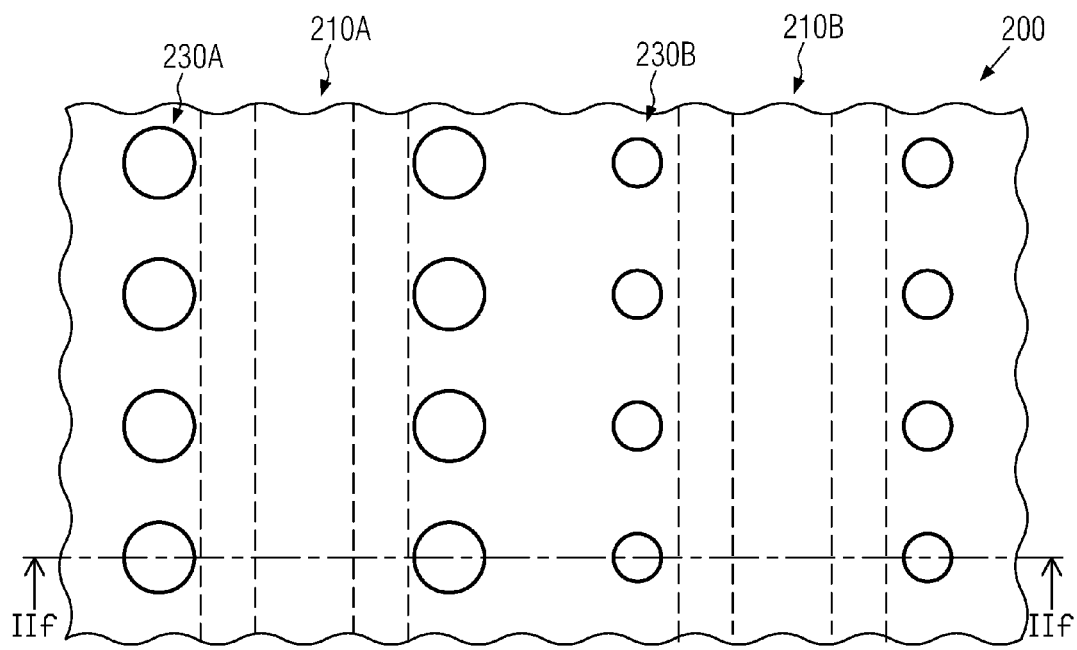
FIG. 2e schematically illustrates a top view of a semiconductor device comprising different device regions, such as different transistors, having a contact structure formed on the basis of different layouts according to still further illustrative embodiments.

FIG. 2e schematically illustrates a top view of the semiconductor device 200 according to a further illustrative embodiment. In this case, the local variation of the layout of respective contact structures may, alternatively or in addition to modifying the design of the contact structure within a single transistor element, be applied to larger device areas such as different transistors 210A, 210B. For example, the transistor 210A, which may have basically the same configuration as shown in FIGS. 1a, 1b, 2a and 2b, may represent a transistor of a specific conductivity type, such as an N-channel transistor, or may represent a transistor having a different configuration compared to the transistor 210B, which may represent a P-channel transistor and the like. In the embodiment shown, the respective contact structures 230A, 230B may differ from each other in the lateral dimension of the respective contact elements so as to reduce the amount of contact material in the second transistor 210B, thereby also reducing an adverse influence with respect to fringing capacitance, stress transfer mechanism and the like.

Figure 2F:
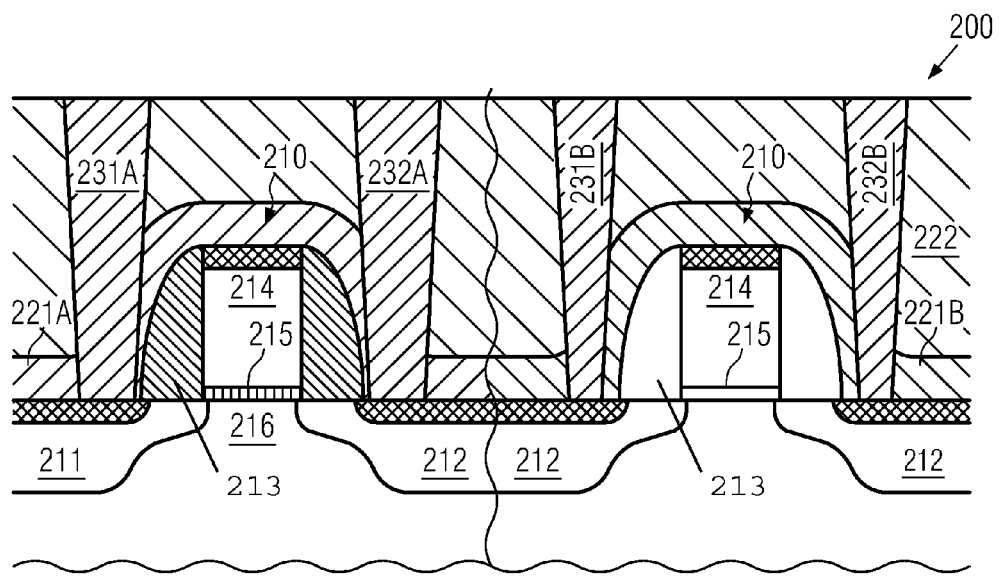
FIG. 2f schematically illustrates a cross-sectional view of the semiconductor device of FIG. 2e.

FIG. 2f schematically illustrates a cross-sectional view of the device 200 as indicated by the line IIf in FIG. 2e. The device 200 may comprise a dielectric material of high intrinsic tensile stress positioned above the first transistor 210A, representing an N-channel transistor, thereby imparting a respective tensile strain to the channel region 216 of this transistor. As previously explained, the highly stressed material may be provided in the form of a corresponding etch stop layer 221A, possibly in combination with additional material having tensile stress and provided within the dielectric layer 222. Similarly, the second transistor 210B, representing a P-channel transistor, may have formed thereabove dielectric material of high compressive stress, which may be provided, for instance, in the form of a respective etch stop layer 221B, thereby creating a respective compressive strain in the channel region 216 of the second transistor 210B. As previously discussed, the intrinsic drive current capability of a P-channel transistor may be less compared to an N-channel transistor due to the reduced charge carrier mobility of P-channel transistors. Consequently, the overall series resistance defined by the contact structure 230B and the internal components of the transistor 210B, that is, the drain and source regions 212, 211 and the channel region 216, may be less dependent on the resistance of the contact structure 230B, thereby allowing an increased resistance for the contact structure 230B without substantially affecting the overall series resistance. Thus, in this case, the fringing capacitance may be efficiently reduced, as previously explained. Furthermore, the strain-inducing mechanism provided by, for instance, the etch stop layer 221B may be significantly higher and may therefore provide a higher relative performance gain in the transistor 210B compared to the transistor 210A due to the significantly higher compressive stress values obtained by respective chemical vapor deposition (CVD) techniques compared to respective tensile stress values, and thus a corresponding reduction of size and/or density of the corresponding contact elements 231B and/or 232B may, therefore, create a reduced stress relaxation in the second transistor 210B. Consequently, the overall performance of the device 200 may be enhanced.

Figure 2G:
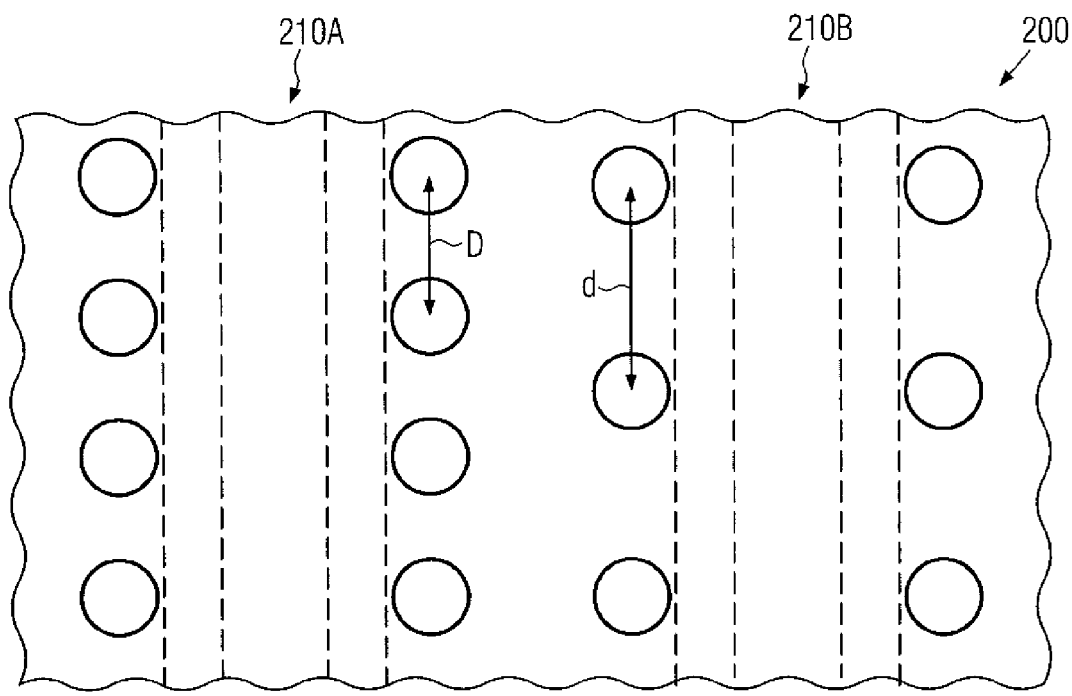
FIGS. 2g-2h schematically illustrate top views of semiconductor devices including different transistors with respective differently designed contact structures according to still further illustrative embodiments.

FIG. 2g schematically illustrates the device 200 according to a further illustrative embodiment in which a corresponding asymmetry between the contact structures 230A, 230B may be obtained by reducing the number of contacts in the structure 230B, that is, the respective distance D between neighboring contact elements in the structure 230B may be reduced compared to the corresponding distance D in the contact structure 230A. Hence, the respective "contact density" is reduced in the structure 230B compared to the structure 230A, irrespective of the actual width of the transistors 210A, 210B. That is, if, for instance, a width of the transistor 210B may be higher due to the generally reduced current drive capability, the contact density may be reduced relative to the transistor 210A by increasing the respective lateral distance of the contacts therein, even if the total number of respective contacts may be equal to or even higher than the corresponding number of contacts in the structure 230A.

Figure 2H:
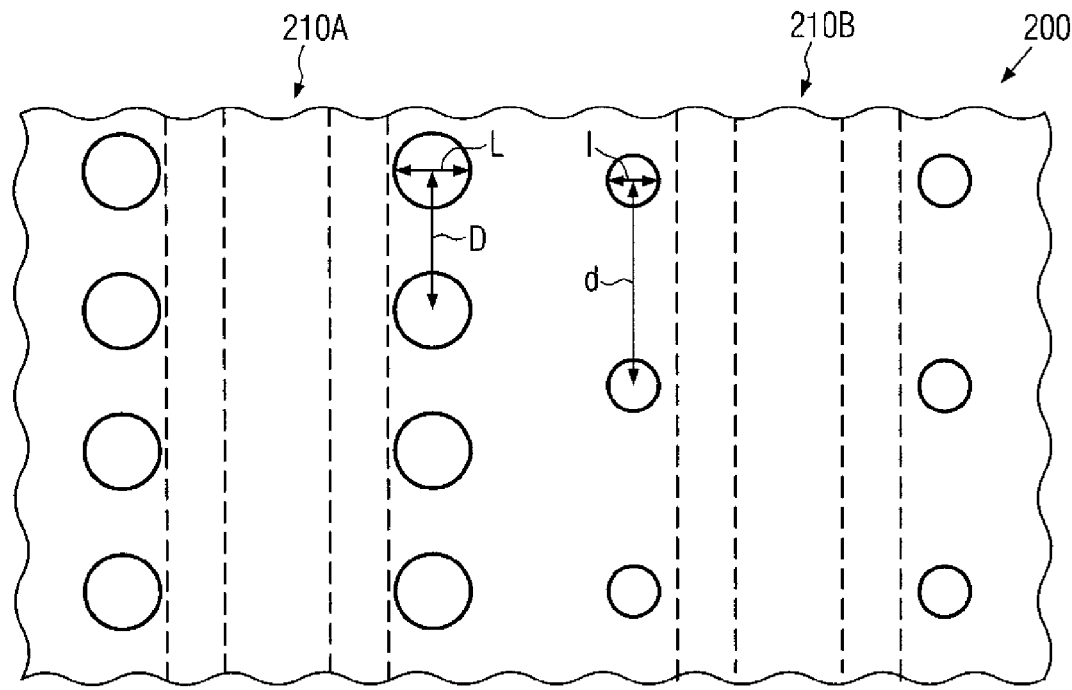

FIG. 2h schematically illustrates the device 200 according to a further illustrative embodiment in which the contact structure 230B may differ in the lateral size and the lateral distance compared to the respective dimensions in the contact structure 230A. It should be appreciated that each of the transistors 210A, 210B may also include a respective "fine" structure with respect to the symmetry of the contact elements. That is, the transistor 210A may itself include a contact structure 230A in such a form as is previously explained with respect to the contact structure 230 as shown in FIGS. 2a-2d. Similarly, the contact structure 230B may also be varied in accordance with the principles outlined with respect to the contact structure 230. Consequently, a high degree of design flexibility may be provided by the principles disclosed herein so as to locally adjust the mutual interaction between respective transistor elements and the associated contact structure. In other illustrative embodiments, a respective variation of the design or layout of contact structures may be performed in a more global manner, that is, extended areas of the semiconductor device 200 may receive a certain type of contact structure, for instance, designed so as to obtain maximum operating speed, while, in other areas, enhanced reliability during the fabrication of contacts may be obtained. For example, in areas of increased packing density, such as random access memory (RAM) areas, the respective contacts may have a reduced size so as to avoid undue short circuits between adjacent transistor elements, whereas, in other areas, such as logic blocks, respective adaptations may be formed so as to obtain enhanced operating speed.

As a result, the present disclosure provides enhanced device performance by locally adapting the characteristics of a contact structure with respect to the respective transistor characteristics, wherein the respective layout, i.e., the respective lateral target dimensions and target distances, may be adapted so as to reduce any negative impact caused by the respective contact elements while not unduly increasing the overall series resistance in the conductive path defined by the transistor and the contact structure. Hence, even within single transistor elements, differently dimensioned contact elements and/or contact elements with a different density may be provided so as to obtain overall performance gain. The principle of the local adaptation of the layout of the contact structure may also be applied to different transistors, which may additionally be individually provided with respectively adapted contact structures, thereby enhancing design flexibility and also providing a significant performance gain.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a first transistor having a drain region and a source region;
a plurality of drain contacts connecting to said drain region, each of said plurality of drain contacts having a first lateral layout dimension; and
a plurality of source contacts connecting to said source region, each of said plurality of source contacts having a second lateral layout dimension, said first lateral layout dimension differing from said second lateral layout dimension to provide a first total amount of contact material over said plurality of drain contacts different than a second total amount of contact material over said plurality of source contacts.

2. The semiconductor device of claim 1, wherein said first total amount of contact material is less than said second total amount of contact material.

3. The semiconductor device of claim 1, wherein the first and second lateral layout dimensions comprise lateral spacing dimensions, and the number of drain contacts differs from the number of source contacts.

4. The semiconductor device of claim 3, wherein the first and second lateral layout dimensions comprise lateral spacing dimensions, and the number of drain contacts is less than the number of source contacts.

5. The semiconductor device of claim 4, further comprising an interlayer dielectric material enclosing said first transistor and said plurality of drain contacts and said plurality of source contacts, said interlayer dielectric material having an intrinsic stress to induce a specific strain in a channel region of said first transistor.

6. The semiconductor device of claim 5, wherein said specific strain is one of a tensile strain and a compressive strain oriented along a channel length direction.

7. The semiconductor device of claim 1, further comprising:
 a second transistor having a second drain region and a second source region;
 a second plurality of drain contacts connecting to said second drain region; and
 a second plurality of source contacts connecting to said second source region, said at least one of said second plurality of drain contacts and said second plurality of source contacts of said second transistor having a third lateral layout dimension that is less than the greater one of said first and second lateral layout dimensions.

8. The semiconductor device of claim 7, wherein said second transistor is a P-channel transistor.

9. The device of claim 7, wherein the first, second, and third lateral layout dimensions comprise lateral target dimensions.

10. The device of claim 7, wherein the first, second, and third lateral layout dimensions comprise lateral spacing dimensions.

11. The device of claim 1, wherein the first and second lateral layout dimensions comprise lateral target dimensions.

12. A semiconductor device, comprising:
 a first transistor having a drain region and a source region;
 a first plurality of drain contacts connecting to said drain region; and
 a second plurality of source contacts connecting to said source region, a number of contacts of said first plurality differing from a number of contacts of said second plurality to provide a first total amount of contact material over said first plurality of drain contacts different than a second total amount of contact material over second said plurality of source contacts.

13. The semiconductor device of claim 12, wherein the number of contacts of said first plurality is less than the number of contacts of said second plurality.

14. The semiconductor device of claim 13, wherein said drain contacts have a different lateral target dimension compared to said source contacts.

15. The semiconductor device of claim 14, wherein the lateral target dimension of said drain contacts is less than the lateral target dimension of said source contacts.

16. The semiconductor device of claim 13, further comprising:
 a second transistor having a drain region and a source region;
 a plurality of drain contacts connecting to said drain region; and
 a plurality of source contacts connecting to said source region, wherein one of a number of said drain contacts per unit length in the second transistor or a number of the source contacts per unit length is less than the greater one of a number of drain contacts per unit length of the first transistor and a number of source contacts per unit length of the first transistor.

17. The semiconductor device of claim 13, further comprising:
 a second transistor having a drain region and a source region;
 a plurality of drain contacts connecting to said drain region; and
 a plurality of source contacts connecting to said source region, wherein at least one of a lateral target dimension of said drain contacts of the second transistor or a lateral target dimension of the source contacts differs from at least one of a lateral target dimension of the drain contacts of the first transistor or a lateral target dimension of the source contacts of the first transistor.

* * * * *